(12) United States Patent
Schwabe et al.

(10) Patent No.: US 11,646,748 B2
(45) Date of Patent: May 9, 2023

(54) ML-BASED PHASE CURRENT BALANCER

(71) Applicant: Infineon Technologies Austria AG, Villach (AT)

(72) Inventors: Benjamin Schwabe, Munich (DE); Salman Nazir, Munich (DE); David Williams, Andover, MA (US)

(73) Assignee: Infineon Technologies Austria AG, Villach (AT)

( * ) Notice: Subject to any disclaimer, the term of this patent is extended or adjusted under 35 U.S.C. 154(b) by 380 days.

(21) Appl. No.: 16/841,213

(22) Filed: Apr. 6, 2020

(65) Prior Publication Data

US 2021/0312275 A1 Oct. 7, 2021

(51) Int. Cl.
*H03M 1/48* (2006.01)
*H03M 1/12* (2006.01)
*H02M 3/04* (2006.01)

(52) U.S. Cl.
CPC ............ *H03M 1/122* (2013.01); *H02M 3/04* (2013.01)

(58) Field of Classification Search
CPC ...... G06N 3/0454; G06N 3/04; G06N 3/0445; G06N 3/049; G06N 3/0635; G06N 3/084; G06N 3/088; H03M 1/485; H03M 1/645; H03M 3/458; H03M 5/08; H02P 23/0077; H02P 21/09; H02P 2207/01; H02P 21/16; H02P 21/00; H02P 21/0014; H02P 21/0025; H02P 21/0089; H02P 21/02; H02P 21/06; H02P 21/08; H02P 21/10; H02P 21/141; H02P 21/18; H02P 21/22; H02P 23/0018; H02P 23/14; H02P 25/02; H02P 27/06; H02P 29/0241; H02P 29/662; H02P 6/12; H02P 6/15

USPC .......... 323/272, 283, 284, 271; 341/112–117
See application file for complete search history.

(56) References Cited

U.S. PATENT DOCUMENTS

| | | | | |
|---|---|---|---|---|
| 5,003,243 | A | * | 3/1991 | Tadakuma ............... H02P 21/09 318/808 |
| 5,196,778 | A | * | 3/1993 | Hayashida ............. G05B 19/19 318/807 |
| 5,365,158 | A | * | 11/1994 | Tanaka ..................... H02P 21/09 318/807 |

(Continued)

OTHER PUBLICATIONS

Jasour, Ashkan M.Z., et al., "Design of a MIMO Controller for a Multimodul De-De Converter Based on Particle Swarm Optimized Neural Network", 2nd IEEE International Conference on Power and Energy (PECon 08), Johor Baham, Malaysia, Dec. 1-3, 2008, pp. 224-230.

(Continued)

*Primary Examiner* — Linh V Nguyen
(74) *Attorney, Agent, or Firm* — Murphy, Bilak & Homiller, PLLC

(57) ABSTRACT

A machine learning (ML)-based phase current balancer for a multiphase power converter includes one or more inputs, one or more outputs, and an artificial neural network. The artificial neural network includes a plurality of artificial neurons and is trained to provide corrective phase current imbalance information at the one or more outputs for correcting phase current imbalance within the multiphase power converter, based on information available at the one or more inputs and indicative of individual phase currents of the multiphase power converter.

20 Claims, 11 Drawing Sheets

(56) References Cited

U.S. PATENT DOCUMENTS

| | | | | |
|---|---|---|---|---|
| 5,576,632 | A * | 11/1996 | Petsche | H02H 7/085 |
| | | | | 706/20 |
| 5,943,660 | A * | 8/1999 | Yesildirek | G05B 13/027 |
| | | | | 706/15 |
| 6,215,271 | B1 * | 4/2001 | Lerow | H02J 7/1492 |
| | | | | 322/58 |
| 6,629,089 | B1 * | 9/2003 | Supino | G11B 5/59605 |
| | | | | 706/15 |
| 6,630,809 | B2 * | 10/2003 | Chen | H02P 21/22 |
| | | | | 318/800 |
| 7,187,155 | B2 * | 3/2007 | Matsuo | H02P 21/09 |
| | | | | 318/400.02 |
| 7,602,164 | B2 * | 10/2009 | Vo | H02M 3/33515 |
| | | | | 323/283 |
| 7,888,923 | B2 | 2/2011 | Sahu | |
| 7,903,433 | B2 * | 3/2011 | Carpenter | H02M 3/1584 |
| | | | | 363/16 |
| 9,369,043 | B2 | 6/2016 | Couleur et al. | |
| 2016/0329714 | A1 * | 11/2016 | Li | H02M 7/537 |
| 2019/0097527 | A1 * | 3/2019 | Bhardwaj | H02M 1/4208 |

OTHER PUBLICATIONS

Maruta, Hidenori, et al., "Improvement of Current Balanced Parallel Soft-Start Operation for DC-DC Converters with Current Prediction", 4th International Conference on Renewable Energy Research and Applications; Palermo, Italy, Nov. 22-25, 2015, pp. 1058-1062.

"Multiphase Buck Design From Start to Finish (Part 1)", Texas Instruments, Application Report, SLVA882A, Apr. 2017, Revised May 2019, accessed online at http://www.ti.com/lit/an/slva882a/slva882a.pdf on Apr. 7, 2020.

"Activation function", Wikipedia, accessed online at https://en.wikipedia.org/wiki/Activation_function on Apr. 6, 2020.

"Adaptive Constant On-Time (D-CAP™) Control Study in Notebook Applications", Texas Instruments, SLVA281B—Jul. 2007—Revised Dec. 2007, accessed online at http://www.ti.com/lit/an/slva281b/slva281b.pdf on Jan. 11, 2020.

"Artificial Neural Network", Wikipedia, accessed online at https://en.wikipedia.org/wiki/Artificial_neural_network on Jan. 11, 2020.

"Buck Converter", Wikipedia, accessed online at https://en.wikipedia.org/wiki/Buck_converter on Jan. 11, 2020.

"Feedforward neural network", Wikipedia, accessed online at https://en.wikipedia.org/wiki/Feedforward_neural_network on Apr. 6, 2020.

"How important is phase-to-phase current balance in multiphase converters?", Texas Instruments, accessed online at https://e2e.ti.com/blogs_/b/powerhouse/archive/2015/09/18/how-important-is-phase-to-phase-current-balance-in-multiphase-converters# on Jan. 11, 2020.

"Multilayer perceptron", Wikipedia, accessed online at https://en.wikipedia.org/wiki/Multilayer_perceptron on Apr. 6, 2020.

"Reinforcement learning", Wikipedia, accessed online at https://en.wikipedia.org/wiki/Reinforcement_learning on Apr. 6, 2020.

"TPS53647 4-Phase, D-CAP+, Step-Down, Buck Controller with NVM and PMBus™ Interface for ASIC Power and High-Current Point-of-Load", Texas Instruments, SLUSC39B—Jun. 2015—Revised Feb. 2017, accessed online at http://www.ti.com/lit/ds/symlink/tps53647.pdf on Jan. 11, 2020.

Borovykh, Anastasia, et al., "Dilated Convolutional Neural Networks for Time Series Forecasting", Journal of Computational Finance, accessed online at https://www.researchgate.net/publication/315096575_Dilated_Convolutional_Neural_Networks_for_Time_Series_Forecasting on Apr. 6, 2020.

Cho, Kyunghyun, et al., "Learning Phrase Representations using RNN Encoder-Decoder for Statistical Machine Translation", Accessed online at https://arxiv.org/abs/1406.1078 on Apr. 6, 2020.

Guo, Yangyang, et al., "Attentive Long Short-Term Preference Modeling for Personalized Product Search", Accessed online at http://export.arxiv.org/abs/1811.10155 on Apr. 6, 2020.

Hochreiter, Sepp, "Long Short-term Memory", Neural Computation, Dec. 1997, accessed online at https://www.researchgate.net/publication/13853244_Long_Short-term_Memory on Apr. 6, 2020.

Kishor, Nand, "5 Things You Need to Know about Reinforcement Learning", Accessed online at http://houseofbots.com/news-detail/2532-4-5-things-you-need-to-know-about-reinforcement-learning on Apr. 6, 2020.

Van Den Oord, AäRon, et al., "WaveNet: A Generative Model for Raw Audio", Deep Mind, Sep. 8, 2016, Accessed online Apr. 6, 2020 at https://deepmind.com/blog/article/wavenet-generative-model-raw-audio.

Vaswani, Ashish, "Attention is All You Need", 31st Conference on Neural Information Processing Systems (NIPS 2017), Long Beach, CA, USA, accessed online at https://arxiv.org/abs/1706.03762 on Apr. 6, 2020.

\* cited by examiner

ML-BASED PHASE CURRENT BALANCER

BACKGROUND

Multiphase power converters are commonly used when high load currents are required, e.g., for DC-DC power conversion for CPUs (central processing units), GPUs (general processing units), etc. This applies to both peak current and thermal design current. Higher load currents often require more phases.

Multiphase power converters include at least two phases and each phase typically has a power stage and an inductor. Increasing power consumption requirements of GPUs, CPUs, and other types of electronic loads require DC-DC power converters to include additional phases in order to adequately power these systems. Implemented correctly, multiphase converters are highly advantageous in these high current applications: they combine the delivery of high currents with high energy-efficiency, low output ripple, good thermal resilience and high performance for load transient responses.

A major challenge in harvesting the benefits of a multiphase design is phase current balance. Mainly, the energy transferred by each phase is ideally equal across the phases over one switching cycle regardless of whether the converter is exposed to a steady state or a transient load. Also, other disturbances may cause phase current imbalance, e.g., different thermal conditions for the power stages, a surge or dip in the input voltage, etc. Phase current imbalance reduces efficiency over circulating currents and may even lead to damage of the DC-DC converter and/or the connected load, e.g., by saturating the inductor. To improve efficiency for light loads, one or more phases may be deactivated under light-load conditions and reactivated if the load current increases above a given threshold. Phase dropping/adding poses another challenge when attempting to balance the phase currents.

Phase current balance may be achieved by using the exact same components and the same layout for each phase. In addition, high quality components with very low tolerance are common. For highly critical applications, component matching may be employed. This requires components to be chosen which tolerate more current than actually needed, especially the output inductor is chosen in such a way that it does not saturate at the expected maximal phase current. This extra margin makes the solution larger, which is a problem especially for mobile devices. Also, higher voltage ratings may be considered, especially for the output capacitors. An additional regulator may be provided for balancing the phase currents. While the concepts vary slightly, the input is the individual phase current and either the regulation output or the switching voltage signal is manipulated directly. Common regulation schemes are based on an error current which is defined by the average current and the individual phase current. This commonly involves measuring the current through one or more phases by appropriate circuitry. The signals are averaged and by means of a differential amplifier, an error voltage signal is generated which is then fed to the modulator driving the phases.

All of the measures described above resolve the phase current balancing issue to some degree. However, as power demand increases and requirements with respect to energy efficiency and transient responses tighten, more phases are being used which demands more flexible and more powerful methods for balancing the phase currents in multiphase power converters.

Thus, there is a need for an improved phase current balancer for multiphase power converters.

SUMMARY

According to an embodiment of a machine learning (ML)-based phase current balancer for a multiphase power converter, the ML-based phase current balancer comprises: one or more inputs; one or more outputs; and an artificial neural network comprising a plurality of artificial neurons and trained to provide corrective phase current imbalance information at the one or more outputs for correcting phase current imbalance within the multiphase power converter, based on information available at the one or more inputs and indicative of individual phase currents of the multiphase power converter.

According to an embodiment of a multiphase power converter, the multiphase power converter comprises: a plurality of phases, each phase being configured to provide a phase current to a load coupled to the multiphase power converter; a modulator configured to generate modulation signals for switching the respective phases so as to regulate an output voltage of the multiphase power converter provided to the load; and a machine learning (ML)-based phase current balancer configured to aid in balancing the phase currents. The ML-based phase current balancer comprises: one or more inputs; one or more outputs; and an artificial neural network comprising a plurality of artificial neurons and trained to provide corrective phase current imbalance information at the one or more outputs for correcting imbalance between the individual phase currents, based on information available at the one or more inputs and indicative of the individual phase currents.

According to an embodiment of an electronic system, the electronic system comprises: a board; a load attached to the board; and a multiphase power converter configured to provide dc power to the load. The multiphase power converter comprises: a plurality of phases, each phase being configured to provide a phase current to the load; a modulator configured to generate modulation signals for switching the respective phases so as to regulate an output voltage of the multiphase power converter provided to the load; and a machine learning (ML)-based phase current balancer configured to aid in balancing the phase currents. The ML-based phase current balancer comprises: one or more inputs; one or more outputs; and an artificial neural network comprising a plurality of artificial neurons and trained to provide corrective phase current imbalance information at the one or more outputs for correcting imbalance between the individual phase currents, based on information available at the one or more inputs and indicative of the individual phase currents.

According to an embodiment of a method for training a machine learning (ML)-based phase current balancer of a multiphase power converter, the method comprises: connecting the multiphase power converter to a test load; and executing a reinforcement-learning algorithm that defines biases and weights for an artificial neural network included in the ML-based phase current balancer, the biases and weights enabling the artificial neural network to provide corrective phase current imbalance information for correcting phase current imbalance that arises within the multiphase power converter while connected to the test load.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein utilize a machine learning (ML)-based method for implementing phase current balancing in multiphase power converters. The ML-based phase current balancer described herein includes an artificial neural network and is trained to provide corrective phase current imbalance information for correcting phase current imbalance within a multiphase power converter, based on information indicative of individual phase currents of the multiphase power converter. For simplification only, the ML-based phase current balancer is described herein in the context of a buck converter multiphase power converter. However, the ML-based phase current balancer may be used with any other kind of multiphase topology for power conversion such as but not limited to boost converters, buck-boost converters, etc.

By employing a machine learning (ML) method for balancing phase current balances in a multiphase power converter, additional information such as ripple information of the output voltage also may be incorporated into the balancing procedure. Additional information about the regulation state allows the ML-based phase current balancer to develop an even more appropriate reaction to detected phase imbalances, especially during fast transients. Described next are various embodiments of the ML-based phase current balancer, methods of training the ML-based phase current balancer, and an electronic system that includes the ML-based phase current balancer.

Figure 1:
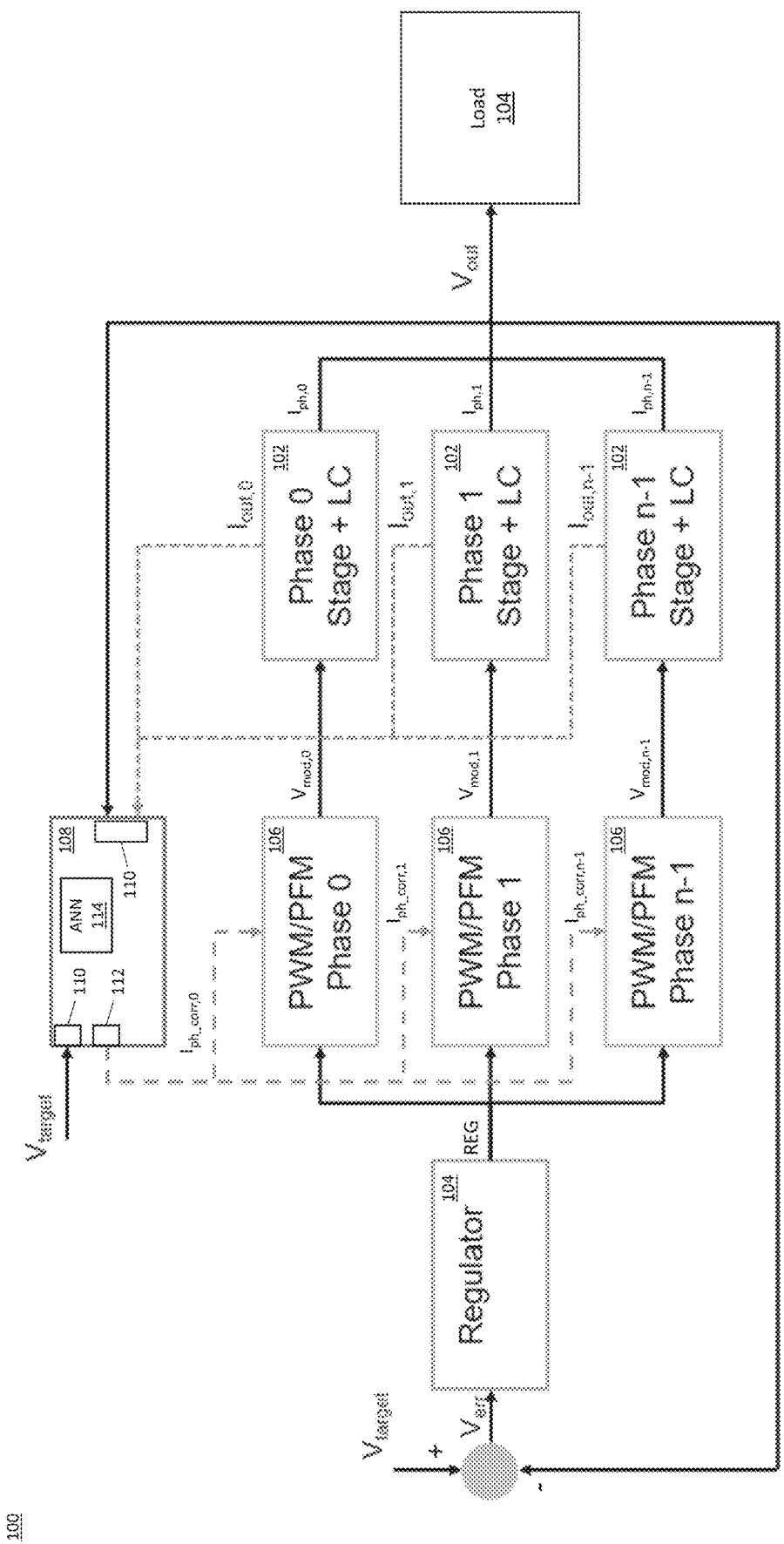
FIG. 1 illustrates a block diagram of an embodiment of a multiphase power converter having a machine learning (ML)-based phase current balancer.

FIG. 1 illustrates an embodiment of a multiphase power converter 100. The multiphase power converter 100 includes N phases 102 where N is a positive integer greater than or equal to 2. Each phase 102 of the multiphase power converter 100 is configured to provide a phase current $I_{ph,x}$ to a load 104 coupled to the multiphase power converter 100. The phases 102 may each include high-side and low-side switch devices such as power MOSFETs (metal-oxide-semiconductor field-effect transistors), related gate driver circuitry, an inductor (L), capacitors (C), etc. These components may be integrated monolithically on the same die (chip) or use a multi-die packaging technology. The driver circuitry of each phase 102 is connected to a modulation signal $V_{mod,x}$ which may be a pulsed voltage for controlling which switch of the corresponding phase 102 is closed (conducting) and which switch device is opened (not conducting), therefore influencing the power converter output voltage $V_{out}$.

The phase modulation signals $V_{mod,x}$ may be pulsed on-off (digital) signals computed from a regulation output REG and may depend on the control strategy, e.g., pulse width modulation (PWM), pulsed frequency modulation (PFM), etc. The underlying regulation scheme is implemented by a regulator 104 such as a PID (proportional-integral-derivative) regulator. The regulator 104 reacts based on an error voltage $V_{err}$ which may be the difference between the measured output voltage value and a target voltage value $V_{target}$. Other implementations of the power converter regulation scheme implemented by the regulator 104 may include bang-bang regulation, PI (proportional-integral) regulation, non-linear regulation schemes, and even more advanced regulation schemes such as model predictive control (MPC), etc.

The multiphase power converter 100 also includes a modulator 106 for generating the modulation signals $V_{mod,x}$ for switching the respective phases 102 to regulate the output voltage $V_{out}$ of the multiphase power converter 100 provided to the load 104. The modulator 106 may implement PWM, PFM, or any other modulation scheme employed in multiphase power converters.

The multiphase power converter 100 also includes a machine learning (ML)-based phase current balancer 108 for balancing the phase currents $I_{ph,x}$ provided to the load 104. The ML-based phase current balancer 108 includes one or more inputs 110, one or more outputs 112, and an artificial neural network (ANN) 114 having a plurality of artificial neurons. The ML-based phase current balancer 108 is trained to provide corrective phase current imbalance information $I_{ph\_corr,x}$ at the one or more outputs 112 for correcting imbalance between the individual phase currents $I_{ph,x}$, based on information available at the one or more inputs 110 and indicative of the individual phase currents $I_{ph,x}$. The ML-based phase current balancer 108 may be implemented as a dedicated circuit in hardware, embedded software executed by a microprocessor or the like, or any combination thereof.

In one embodiment, the information available at the one or more inputs 110 of the ML-based phase current balancer 108 includes phase current measurements $I_{out,x}$ for the individual phases 102 of the multiphase power converter 100. According to this embodiment, the artificial neural network 114 of the ML-based phase current balancer 108 is trained to provide the corrective phase current imbalance information $I_{ph\_corr,x}$ at the one or more outputs 112 based on the phase current measurements $I_{out,x}$ available at the one or more inputs 110.

The phase current measurements $I_{out,x}$ may be obtained by equipping each phase 102 with current sensing functionality, e.g., which transforms the current $I_{ph,x}$ provided by the corresponding phase 102 into a voltage. For example, the sense circuitry may implement MOSFET RDS(on) sensing where RDS(on) is the on-state of a MOSFET when in the on (conducting) state. The sense circuitry may instead sense an amplified voltage across a current sense resistor. Other current sense options are hall effect sensors, inductor direct current resistance (OCR) sensing circuits, etc.

In each case, peak phase current may be measured. The peak phase current occurs right with the falling edge of the switching signal which leads to opening of the high-side switch device and closing of the low-side switch device of the corresponding phase 102. The peak phase current provides a good measure for the risk of system failing due to a saturated inductor, Depending on the regulation scheme, inductor values, etc., the phase current measurements $I_{out,x}$ may be the average current measured from one rising edge to the next rising edge of the corresponding phase modulation signal Transformed phase current signals $V(I_{out,x})$, which are voltages, may be input directly into an ADC. In another option, an analog-averaged signal of all the phase currents may be generated from the transformed phase current signals $V(I_{out,x})$. The difference between the individual phase current error and the average value may be fed as an amplified signal into an ADC.

Separately or in combination, the information available at the one or more inputs 110 of the ML-based phase current balancer 108 may include temperature information for the individual phases 102 of the multiphase power converter 100. Temperature information available for each phase 102 indicates whether one phase 102 is running hotter than another phase 102, For example, current imbalance over a long period of time, a defect in a power stage, physical location, etc. each influence temperature variation across the phases 102. The artificial neural network of the ML-based phase current balancer 108 may be trained to provide corrective phase current imbalance information $I_{ph\_corr,x}$ at the one or more outputs 112 of the ML-based phase current balancer 108 also based on phase temperature information available at the one or more inputs 110 of the ML-based phase current balancer 108.

Separately or in combination, the information available at the one or more inputs 110 of the ML-based phase current balancer 108 may include output voltage ($V_{out}$) and/or error voltage ($V_{err}$) information for the multiphase power converter 100, For example, the output voltage $V_{out}$ may be fed into an ADC or an offset may be created from the output voltage $V_{out}$, e.g., with either the target voltage $V_{target}$ or some averaged value offset. The error voltage $V_{err}$ used as input for the regulation also may be input to the ML-based phase current balancer 108. In each case, the artificial neural network 114 of the ML-based phase current balancer 108 is trained to provide corrective phase current imbalance information $I_{ph\_corr,x}$ at the one or more outputs 112 based on the output voltage and/or error voltage information available at the one or more inputs 110.

Figure 2:
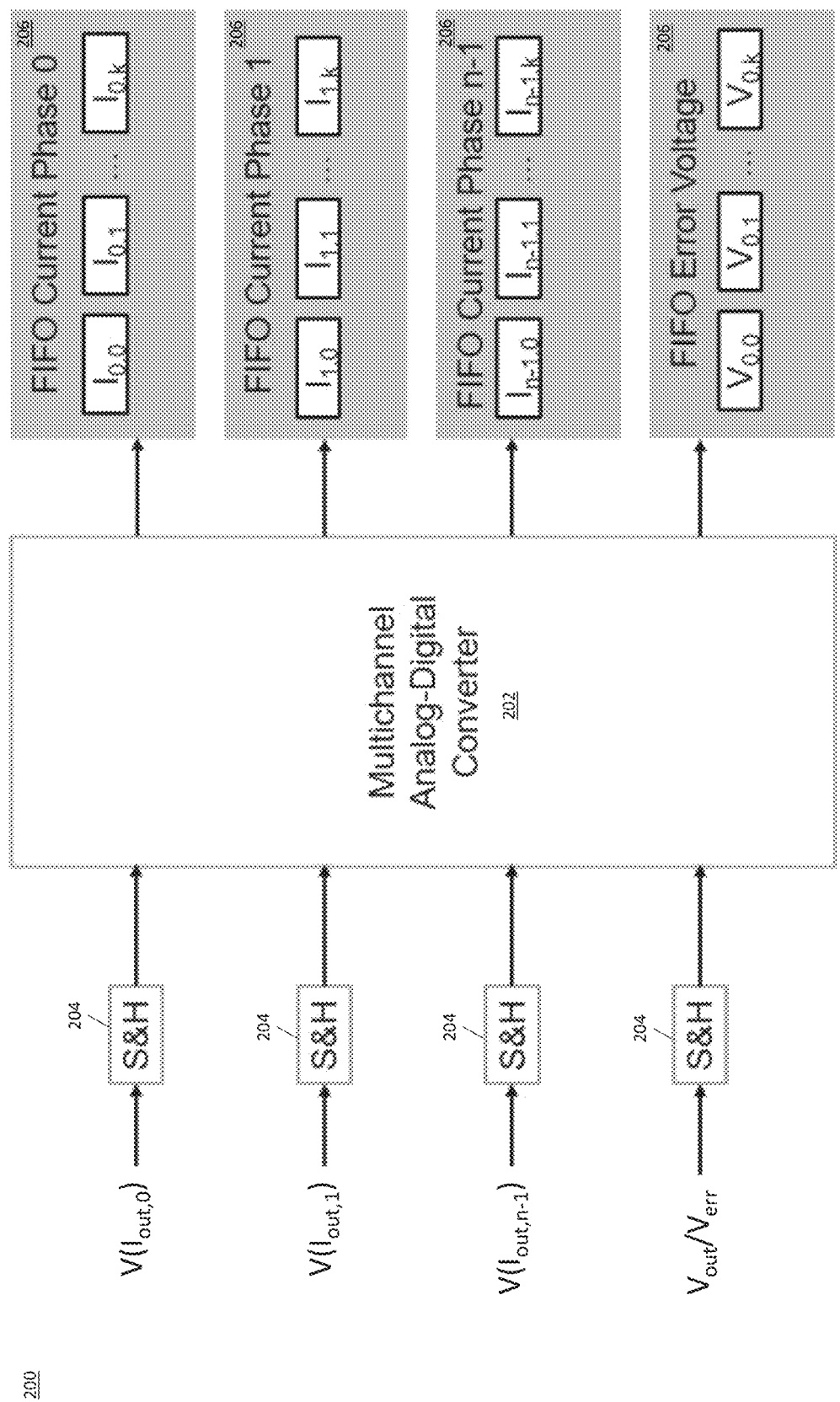
FIG. 2 illustrates a block diagram of an embodiment of an analog-to-digital circuit for converting transformed phase current signals into corresponding digital values.

FIG. 2 illustrates an embodiment of an ADC circuit 200 for converting transformed phase current signals $V(I_{out,x})$, which are voltages, into corresponding digital values. Separately or in combination, the ADC circuit 200 may convert output voltage and/or error voltage information ($V_{out}/V_{err}$) for the multiphase power converter 100 into corresponding digital values. The transformed phase currents $V(I_{out,x})$ and/or the output/error voltage information ($V_{out}/V_{err}$) are fed into a multi-channel ADC 202 after having been (briefly) stored in respective sample and hold (S&H) units 204. After analog-to-digital conversion by the multi-channel ADC 202, each digitized set of values $I_{0,x}, I_{0,1}, \ldots, I_{0,k}; V_{0,x}, V_{0,1}, \ldots, V_{0,k}$ is stored by a respective first-in first-out (FIFO) memory queue 206 and represents a temporal evolution of the phase current $i_{ph,x}$ for the corresponding phase 102 and/or output/error voltage ($V_{out}/V_{err}$) of the multiphase power converter 100.

The artificial neural network 114 of the ML-based phase current balancer 108 uses the digitized values $I_{0,x}, I_{0,1}, \ldots, I_{0,k}; V_{0,x}, V_{0,1}, \ldots, V_{0,k}$ provided by the ADC circuit 200 as input. The artificial neural network 114 is trained to provide corrective phase current imbalance information $I_{ph\_corr,x}$ for each phase 102 based on the digitized sets of phase current values $I_{0,x}, I_{0,1}, \ldots, I_{0,k}$ and/or based on the digitized set of output/error voltage values $V_{0,x}, V_{0,1}, \ldots, V_{0,k}$ provided by the ADC circuit 200. The controller of the multiphase power converter 100 may be equipped with a multi-channel ADC, e.g., as shown in FIG. 2, or with a high-speed ADC having sample-and-hold circuits for transforming all analog voltages into digital, numerical values.

As explained above, the information input to the ML-based phase current balancer 108 and which is indicative of the individual phase currents $I_{ph,x}$ may include phase current measurements $I_{out,x}$ for the individual phases 102, temperature information for the individual phases 102, output voltage ($V_{out}$) information for the multiphase power converter 100 and/or error voltage ($V_{err}$) information for the multiphase power converter 100. Each of these approaches increases flexibility of the phase balancing approach. However, the latency—i.e. the time needed for the ML-based phase current balancer 108 to react to an event—may still be high for quickly changing load conditions. For example, the current measurement for each phase 102 must be measured, e.g., over one switching cycle, potentially averaged, then converted into a digital signal. Only then are phase current balancing computations executed by the ML-based phase current balancer 108. Output voltage ($V_{out}$) and error voltage ($V_{err}$) information may have even more latency.

To further reduce latency, the information input to the ML-based phase current balancer 108 may be derived from or correspond to the individual phase modulation signals $V_{mod,x}$ instead of or in addition to direct phase current measurements $I_{out,x}$. Considering that high-performance controllers for multiphase power converters are digital, the latency described above may be reduced by inputting phase modulation information to the ML-based phase current balancer 108. The phase modulation information is digital and thus has less latency than direct current measurements, and is indicative of the individual phase currents $I_{ph,x}$.

Figure 3:
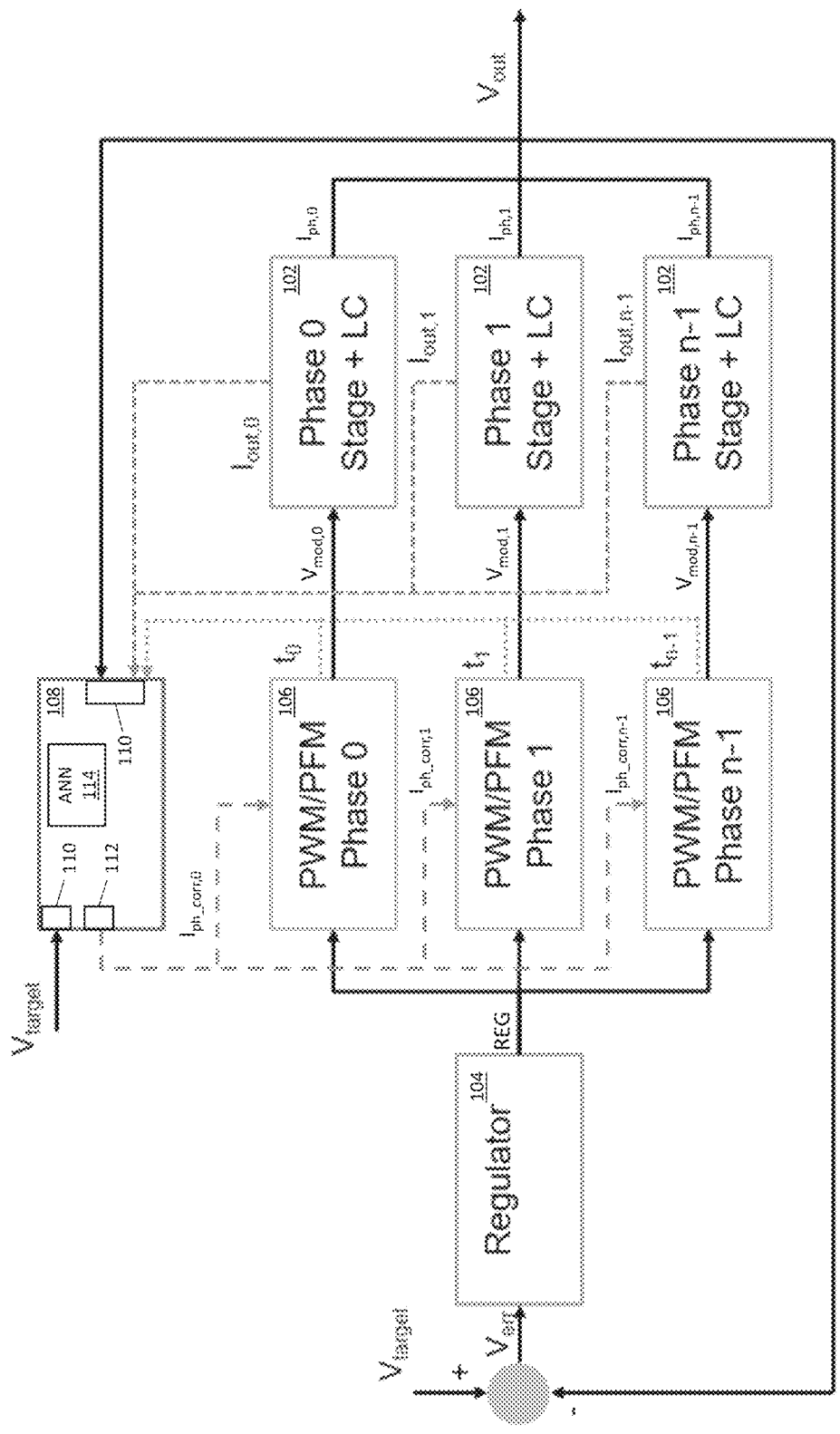
FIG. 3 illustrates a block diagram of another embodiment of a multiphase power converter having an ML-based phase current balancer.

FIG. 3 illustrates another embodiment of a multiphase power converter 300. The multiphase power converter 300 shown in FIG. 3 is similar to the multiphase power converter 100 shown in FIG. 1. Different, however, the information available at the one or more inputs 110 of the ML-based phase current balancer 108 includes phase modulation information such as duty cycle information $t_x$ for the individual phases 102 of the multiphase power converter 300, The artificial neural network 114 of the ML-based phase current balancer 108 is trained to provide corrective phase current imbalance information $I_{ph\_corr,x}$ at the one or more outputs 112 of the ML-based phase current balancer 108 based on the phase modulation information available at the one or more inputs 110 of the ML-based phase current balancer 108.

For example, in the case of PWM modulation where switching frequency is fixed and the duty cycle of the modulation signals $V_{mod,x}$ is adjusted to regulate the output voltage $V_{out}$ of the multiphase power converter 300, duty cycle information $t_x$ input to the ML-based phase current balancer 108 may include on-time information, off-time information and tristate-time information for the individual phases 102 of the multiphase power converter 300. The on-time information, off-time information and tristate-time information for the individual phases 102 are digital measurements or values which relate to the phase currents $i_{ph,x}$. A time vector $t_x$ for each phase 102 may be input to the ML-based phase current balancer 108 and include on-time information, off-time information and tristate-time information for that phase 102.

Figure 4:
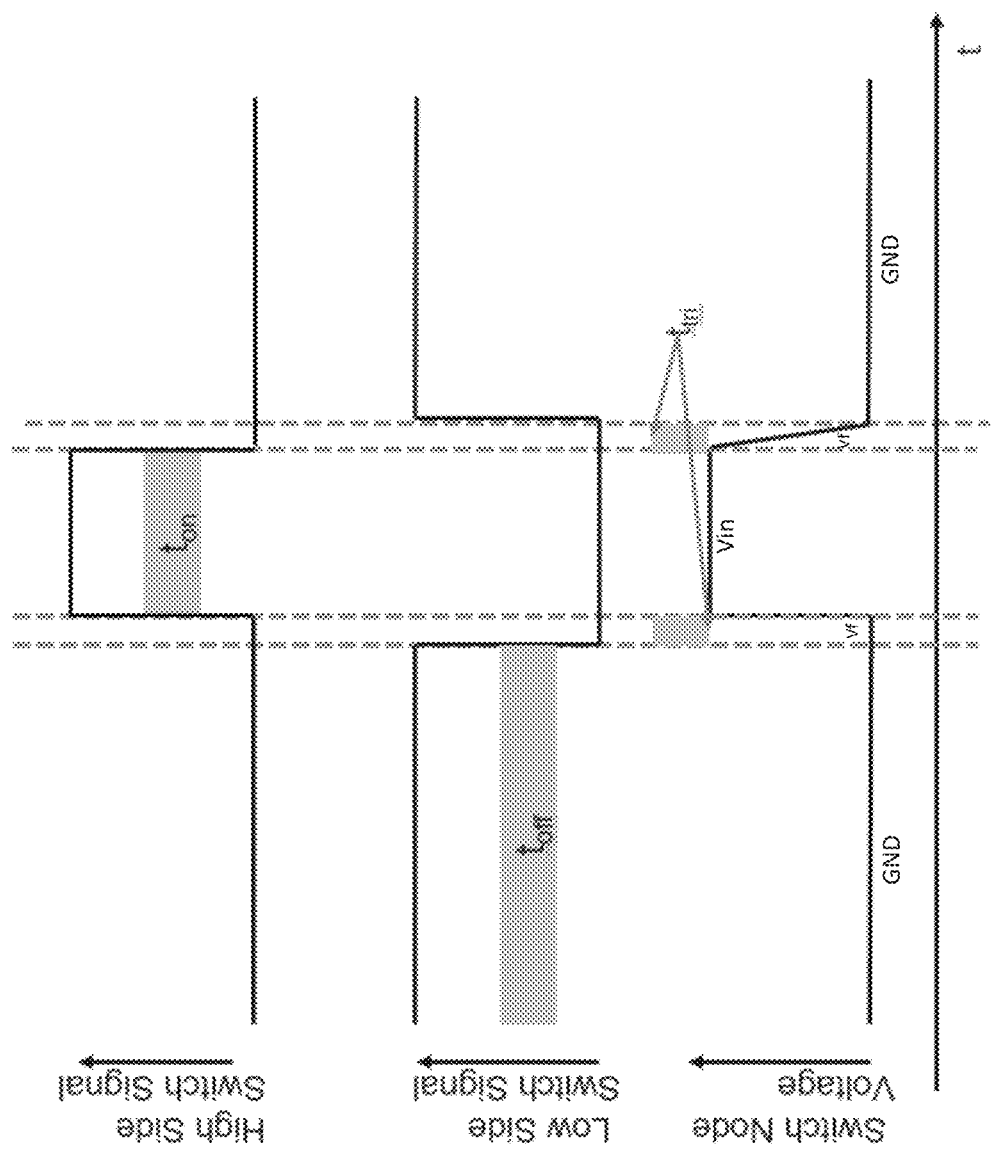
FIG. 4 illustrates a waveform diagram for signals of a modulator.

The modulator 106 may provide the time vector $t_x$ to the ML-based phase current balancer 108. The on-time ($t_{on}$) represents the time the high-side switch device of the corresponding phase 102 is conducting and the low-side switch device is blocking. The switching node between the high-side switch device and the low-side switch device is subjected to the input voltage (Vin) when the high-side switch device is conducting and the low-side switch device is blocking, as shown in FIG. 4. The off-time ($t_{off}$) represents the time the low-side switch device of the corresponding phase 102 is conducting and the high-side switch device is blocking. The switching node between the high-side switch device and the low-side switch device is at ground (GND) when the low-side switch device is conducting and the high-side switch device is blocking, also as shown in FIG. 4. A floating switch node voltage ($V_f$) is characterized by the tristate time ($t_{tri}$), also as shown in FIG. 4.

The artificial neural network 114 of the ML-based phase current balancer 108 may be trained to provide corrective phase current imbalance information $I_{ph\_corr,x}$ at the one or more outputs 112 of the ML-based phase current balancer 108 based on the phase-specific on-time information, off-time information and tristate-time information available at the one or more inputs 110 of the ML-based phase current balancer 108. The phase-specific duty cycle information $t_x$ is indicative of the individual phase currents $i_{ph,x}$ but with less latency compared to the phase current information $I_{out,x}$ since current measurement and analog-to-digital conversion steps may be skipped. Depending on requirements regarding precision, application and phase considerations, measuring the individual output currents $I_{out,x}$ may be skipped since the difference between the target voltage $V_{target}$ and the output voltage $V_{out}$ also provides a good indication of whether the multiphase power converter 300 is in steady-state or subject to a load transition.

Figure 5:
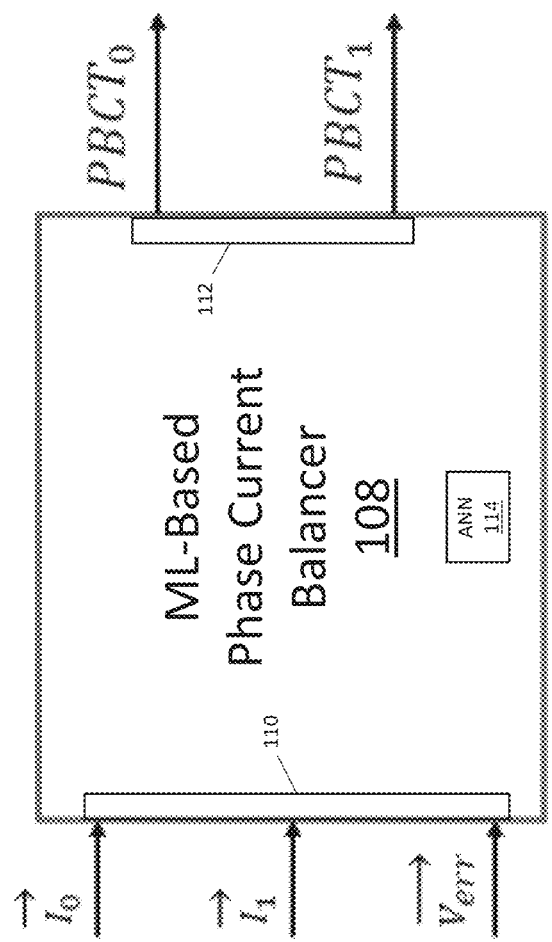
FIG. 5 illustrates a block diagram of an embodiment of an ML-based phase current balancer.

FIG. 5 illustrates an embodiment of the ML-based phase current balancer 108. The artificial neural network 114 of the ML-based phase current balancer 108 may be trained to provide corrective phase current imbalance information $I_{ph\_corr,x}$ at the one or more outputs 112 as respective correction terms $PBCT_x$ for the individual phases 102 of the multiphase power converter 100, 300. For simplicity, a two-phase system is considered. However, the calculus applies for any number of phases 102. In the two-phase scenario, the ML-based phase current balancer 108 produces two corrections terms $PBCT_0$ and $PBCT_1$ from three time series/vector inputs $\vec{I}_0, \vec{I}_1, \vec{V}_{err}$. The first two time series/vector inputs, $\vec{I}_0$ and $\vec{I}_1$, represent a temporal evolution of the two corresponding phase currents. The third time series/vector input, indicates the error voltage and thus the error current. Only for simplicity, it is assumed that the time series/vector inputs $\vec{I}_0, \vec{I}_1, \vec{V}_{err}$ to the ML-based phase current balancer 108 have the same sampling frequency and the same length l. However, particularly for the error voltage time series/vector input $\vec{V}_{err}$, a higher sampling frequency may be considered for a better resolution of the ripple. An input layer of the neural network 114 may perform the transformations with respect to average currents or any other normalization as explained earlier.

Figure 6:
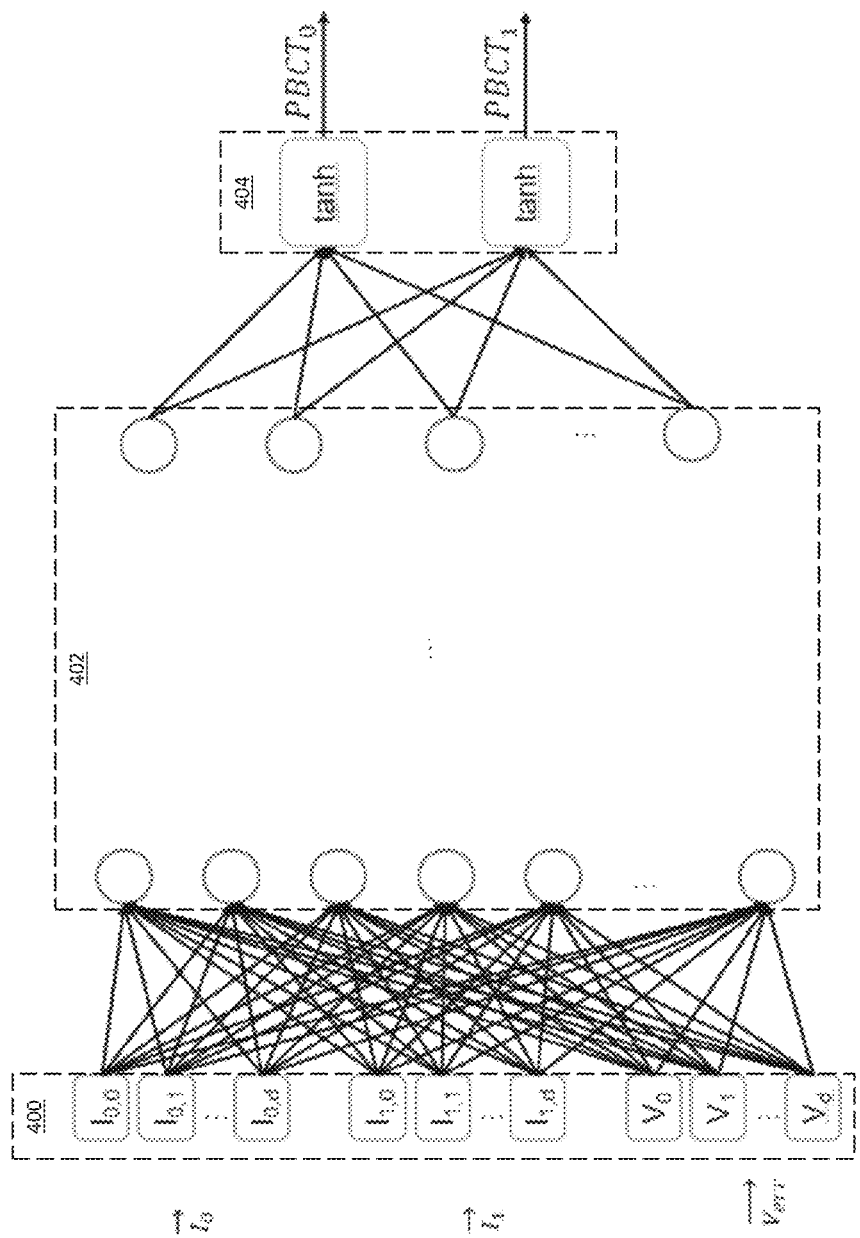
FIG. 6 illustrates a block diagram of an embodiment of an artificial neural network included in an ML-based phase current balancer.

FIG. 6 illustrates an embodiment of the artificial neural network 114 included in the ML-based phase current balancer 108. According to this embodiment, the artificial neural network 114 is based on a multilayer perceptron or other type of feedforward neural network and includes artificial input neurons 400, artificial hidden neurons 402 and artificial output neurons 404.

The artificial neural network 114 may be trained to set the correction terms $PBCT_0$, $PBCT_1$ to zero if the phase currents $i_{ph,x}$ of the multiphase power converter 100, 300 are balanced and the voltage error $V_{err}$ for the multiphase power converter 100, 300 is within a defined range. The artificial neural network 114 also has positive and negative branches between the artificial neurons 400, 402, 404 such that an individual one of the correction terms $PBCT_0$, $PBCT_1$ is negative if the corresponding phase current of the multiphase power converter 100, 300 is below a first threshold and positive if the corresponding phase current $i_{ph,x}$ is above a second threshold. Accordingly, if the artificial neural network 114 determines that an individual phase current $i_{ph,x}$ is too small, the corresponding correction term $PBCT_0$/$PBCT_1$, is made negative which in turn increases on-time of the corresponding phase 102. If the artificial neural network 114 determines that an individual phase current $i_{ph,x}$ is too large, the corresponding correction term $PBCT_0$/$PBCT_1$ is made positive which in turn increases off-time of the corresponding phase 102.

The tanh(.) activation function is shown in FIG. 6 for the artificial output neurons 404. The tanh(.) activation function yields a 1 or 0 output and therefore will provide the $PBCT_x$ values described above. Other activation functions may be used for the artificial output neurons 404 such as but not limited to ArcTan(.), SoftSign(.), ISRU(.) and SQNL(.). These activation functions also will yield the $PBCT_x$ values described above.

The intersecting lines shown in FIG. 6 indicate connections between the individual artificial neurons 400, 402, 404. In a simple architecture, the input, output and hidden layers of the artificial neural network 114 are connected densely meaning that there is a weighted connection from each and every neuron 400/402/404 in one layer to each and every neuron 400/402/404 in the next layer.

Regardless of the type of artificial neural network architecture, the artificial neural network 114 may be trained to limit the correction terms $PBCT_0$, $PBCT_1$ regardless of the degree of phase current imbalance within the multiphase power converter 100, 300 and/or the amount of voltage error $V_{err}$ for the multiphase power converter 100, 300. If the multiphase power converter 100, 300 is highly unbalanced or subjected to a highly transient load, this already causes a reaction by the regulator 104 which may decide, e.g., to dampen or boost accordingly. Limiting the value of the correction terms $PBCT_0$, $PBCT_1$ reduces the likelihood of an overcorrection under extreme conditions.

Figure 7:
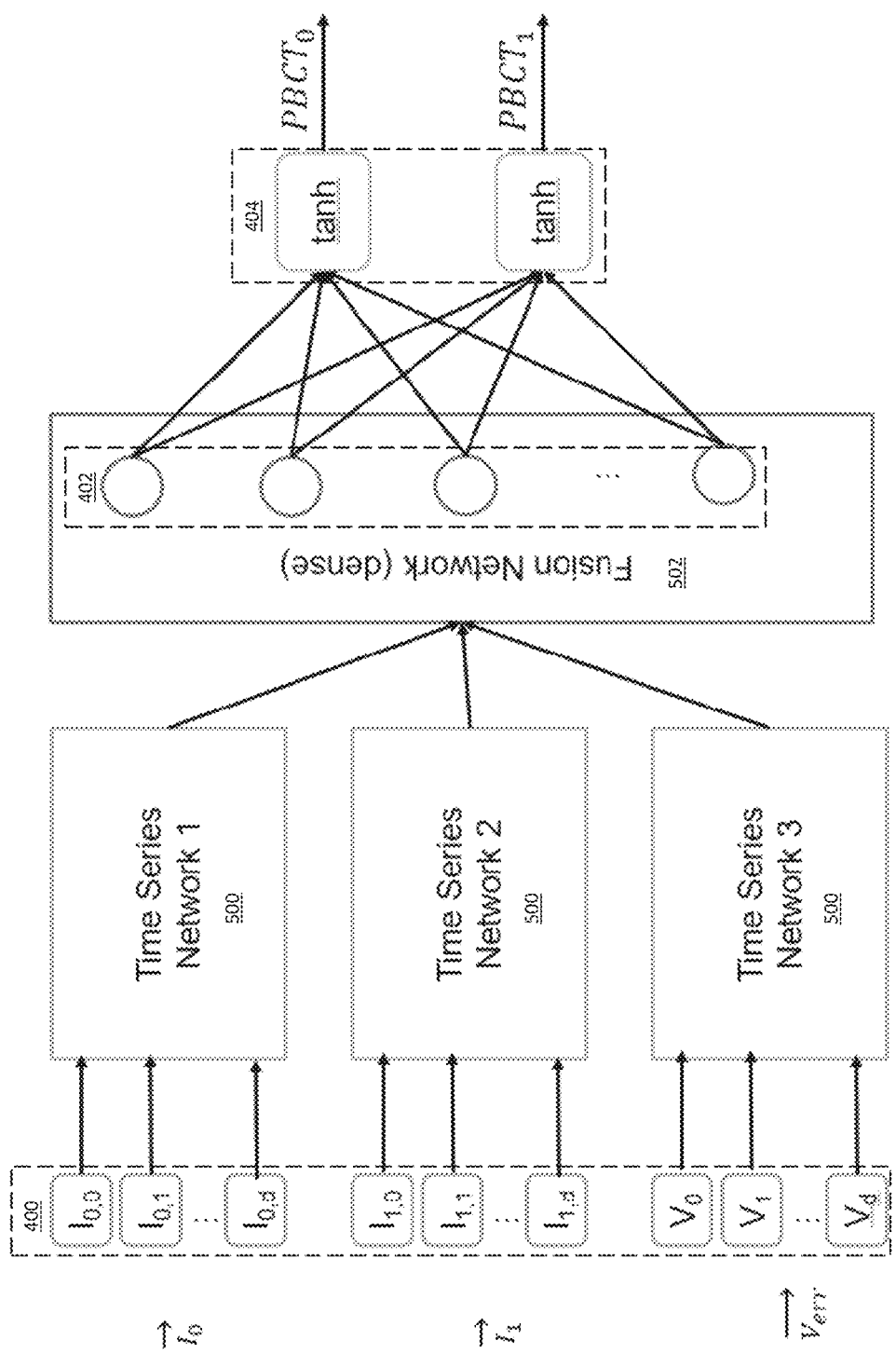
FIG. 7 illustrates a block diagram of another embodiment of an artificial neural network included in an ML-based phase current balancer.

In addition to setting and possibly even limiting the permissible range of output values for the correction terms $PBCT_0$, $PBCT_1$, the structure of the artificial neural network 114 may be adapted to further optimize processing efficiency. In FIGS. 5 and 6, the artificial neural network 114 handles four different time series/vectors: $\vec{I}_0, \vec{I}_1, \vec{V}_{err}$, and PBCT$_x$. There are many possibilities for efficiently handling the four different time series/vectors $\vec{I}_0$, $\vec{I}_1$, $\vec{V}_{err}$, PBCT$_x$ using artificial neural networks, FIG. 7 illustrates another embodiment of the artificial neural network 114 included in the ML-based phase current balancer 108. According to this embodiment, the information available at the one or more inputs 110 of the ML-based phase current balancer 108 includes a separate time series/vector $\vec{I}_0$, $\vec{I}_1$ for each phase 102 of the multiphase power converter 100, 300 and a third time series vector $\vec{V}_{err}$ which represents the error voltage of the multiphase power converter 100, 300. The artificial neural network 114 includes individual first neural networks 500 for processing the separate input time series/vectors $\vec{I}_0$, $\vec{I}_1$, $\vec{V}_{err}$ and a denser second neural network 502 for combining outputs of the individual first neural networks 500.

Artificial neural network architectures for time series handling may include recurrent neural networks. For example, causal dilated neural networks may be used for time series analysis. While still being a feedforward neural network, the structure of causal dilated neural networks reduces the amount of weights which makes training and inference computationally inexpensive. For time series problems, recurrent neural networks also provide repeatable performance. Long short-term memory networks and gated recurrent units are just two examples of recurrent neural networks. Attention mechanisms may be provided to boost the performance of a recurrent neural network. The artificial neural network 114 of the ML-based phase current balancer 108 described herein may utilize any of these architectures, with the architecture selection depending on the exact application and associated requirements.

The correction information PBCT$_x$ output by the artificial neural network 114 may be used to modify the modulation and/or regulation behaviour of the multiphase power converter 100, 300. For example, the correction values PBCT$_0$, PBCT$_1$ output by the ML-based phase current balancer 108 may be added/subtracted to the output REG of regulator 104 for each switching cycle. This approach may be well-suited for dual-edge regulation schemes. Separately or in combination, the correction values PBCT$_0$, PBCT$_1$ output by the ML-based phase current balancer 108 may be used as an offset in the modulator 106 so that the modulation starts at an offset instead of zero in the case of PFM or PWM.

In one embodiment, the modulator 106 uses the corrective phase current imbalance information PBCT$_x$ provided by the ML-based phase current balancer 108 in generating the modulation signals V$_{mod,x}$ for switching the respective phases 102. For example, the modulator 106 may generate the modulation signals V$_{mod,x}$ for the respective phases 102 by comparing a timer counter TC(t) to a reference value RV(t) for each phase 102 and setting the level of the corresponding modulation signal V$_{mod,x}$ accordingly, e.g., as given by:

$$V_{mod,x}(t) = \begin{cases} 0 & TC_k(t) < RV_k(t), \\ 1 & \text{else} \end{cases} \quad (1)$$

where k is an index indicating the individual phase 102.

Figure 8:
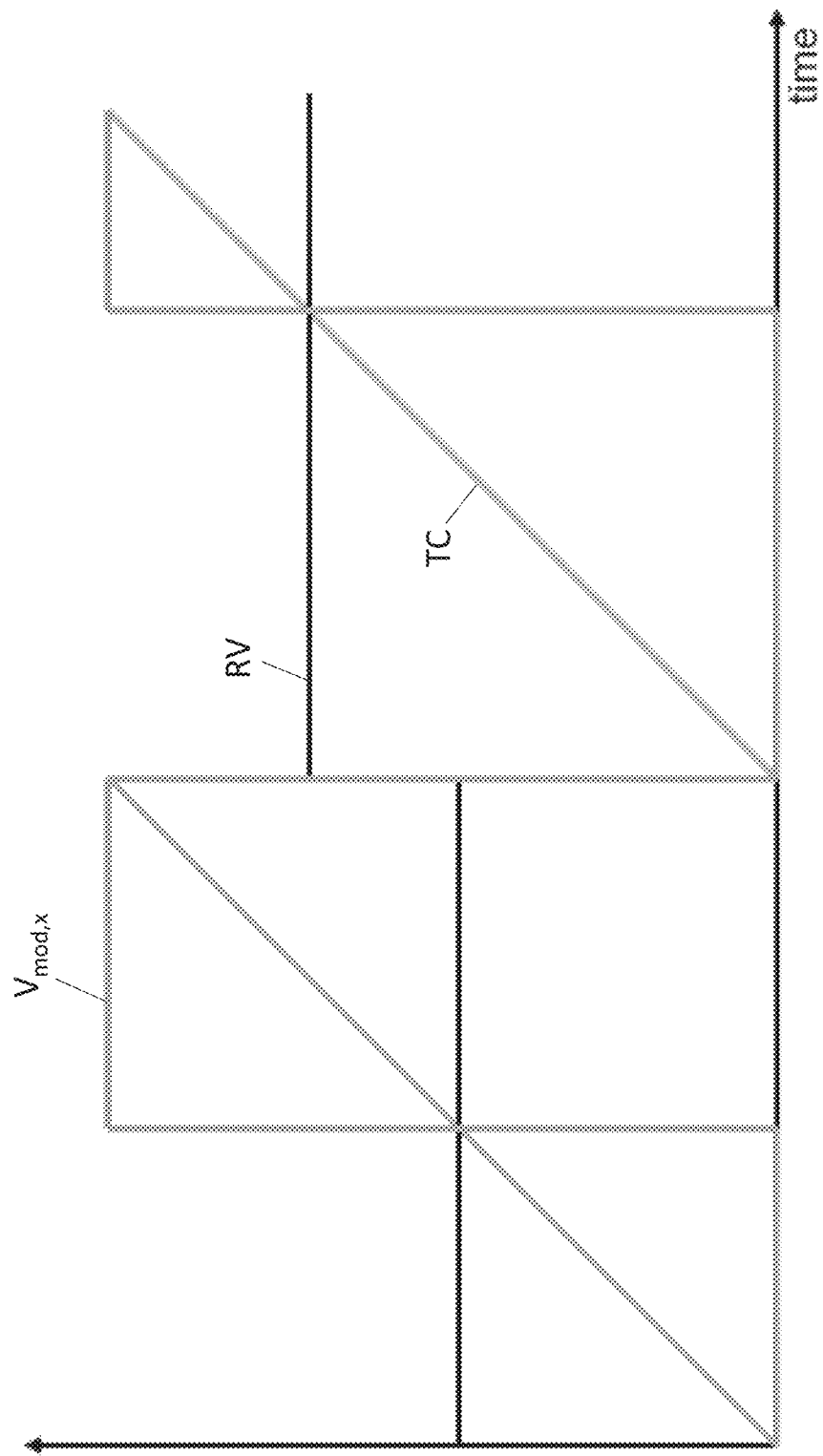
FIG. 8 illustrates a waveform diagram for modifying modulator operation based on an output of an ML-based phase current balancer.

FIG. 8 provides a graphic representation of this approach. The regulation output together with the regulation strategy (e.g., PWM, constant on-time, PFM, etc.) and potentially an over current protection mechanism may form the basis for computing the reference value RV(t), which is updated for each phase 102 and switching cycle. The modulator 106 may update the reference value RV(t) for each phase 102 based on the corrective phase current imbalance information PBCT$_x$ provided by the ML-based phase current balancer 108.

The output PBCT$_x$ of the ML-based phase current balancer 108 may become an input to the computation of the reference value RV(t), which may be updated for each switching cycle and for each phase 102 individually. For example, the modulator 106 may add the output PBCT$_x$ of the ML-based phase current balancer 108 as a correction term PBCT(t) to the reference value RV(t) for the corresponding phase 102 as given by:

$$RV_k^{new}(t) = RV_k(t) + PBCT_k(t) \quad (2)$$

Over current protection modifications may be applied based on RV$^{new}$(t) instead of RV(t).

Described next are various embodiments for training the ML-based phase current balancer 108. In one embodiment, appropriate values for the correction values PBCT$_0$, PBCT$_1$ output by the ML-based phase current balancer 108 are learned using a reinforcement learning approach. Reinforcement learning is an algorithm that defines biases and weights of the artificial neural network 114. To minimize overhead, the reinforcement learning mechanism may be implemented outside the multiphase power converter controller.

Figure 9:
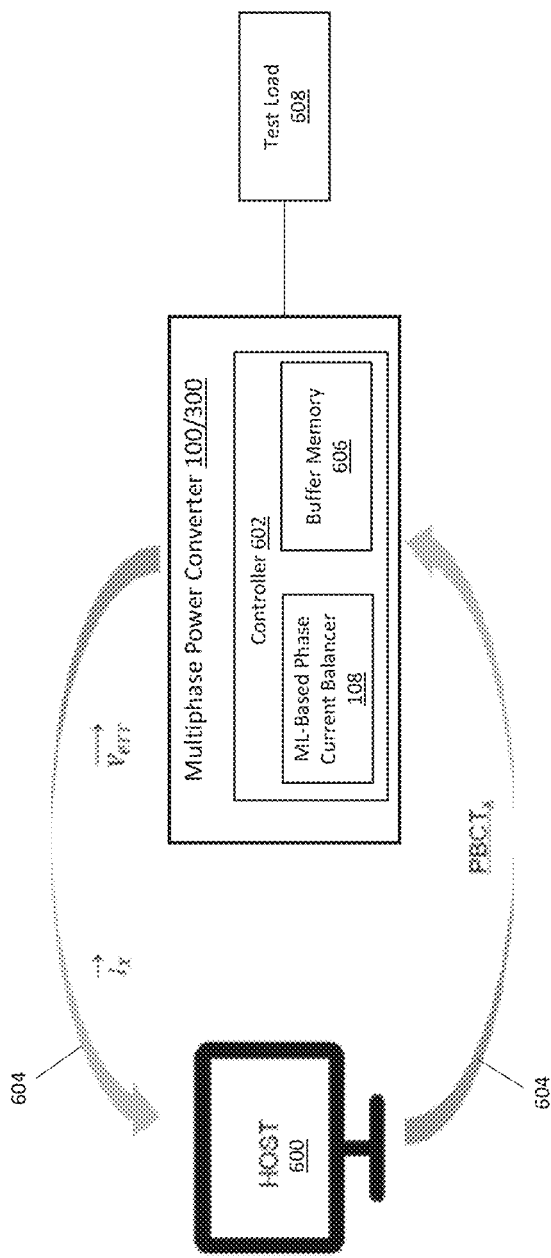
FIG. 9 illustrates a block diagram of an embodiment of an ML-based system for training an artificial neural network of an ML-based phase current balancer.

FIG. 9 illustrates an embodiment in which a host computer or another dedicated training chip 600 communicates with the multiphase power converter 100, 300. The multiphase power converter 100, 300 includes the ML-based phase current balancer 108, as previously explained herein. The host system 600 runs the reinforcement-learning algorithm. An interface 604 with sufficient bandwidth is provided, and/or at least a controller 602 of the multiphase power converter 100, 300 includes buffer memory 606, so that all necessary data can be accessed from the host system 600. Besides a direct connection to the host system 600, the reinforcement-learning algorithm may be executed inside a computing cloud environment with a local computer PC only acting as a gateway to the host system 600. For some applications, the controller 602 may be directly capable to directly interface with a cloud-based host system 600.

To train the ML-based phase current balancer 108, the multiphase power converter 100, 300 is connected to a test load 608. The host system 600 executes a reinforcement-learning algorithm that defines biases and weights for the artificial neural network 114 included in the ML-based phase current balancer 108, The biases and weights learned through the reinforcement-learning algorithm enable the artificial neural network 114 to provide corrective phase current imbalance information I$_{ph\_corr,x}$ for correcting phase current imbalance that arises within the multiphase power converter 100, 300 while connected to the test load 608. Connecting the multiphase power converter 100, 300 to the test load 608 provides an ML environment in which the ML agent learns an optimal phase current balancing behaviour by trial and error using feedback from the ML environment.

Figure 10:
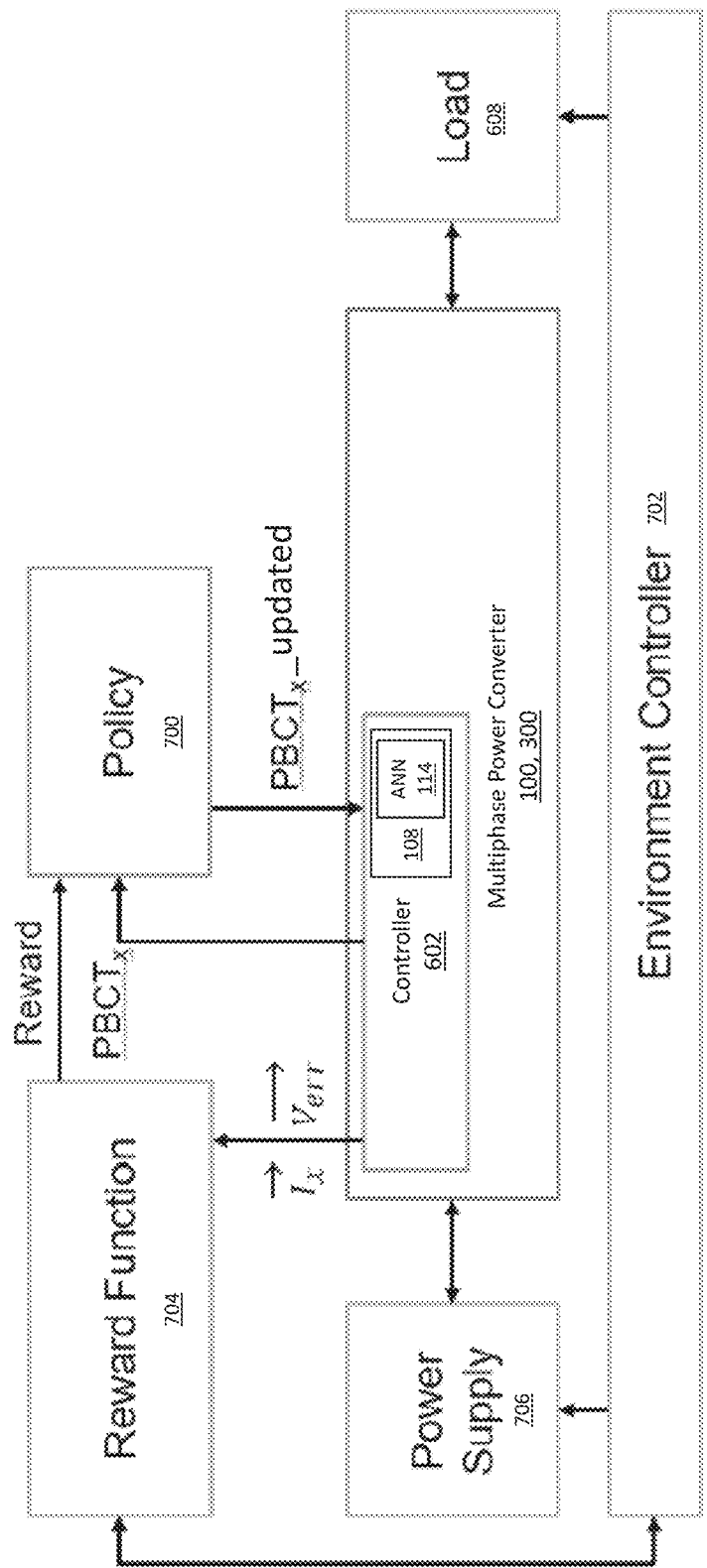
FIG. 10 illustrates a block diagram of another embodiment of an ML-based system for training an artificial neural network of an ML-based phase current balancer.

FIG. 10 illustrates an embodiment of the ML environment. Part of the ML agent may be located inside the multiphase power converter controller 602, e.g., inside the artificial neural network 114 of the ML-based phase current balancer 108. The host system 600 may provide another function of the ML agent: a policy 700 that maps the states, which are the current values of the corrective phase current imbalance information PBCT$_x$, to some actions such as updated values for PBCTx. The host system 600 may also include an environment controller 702 and provide a reward function 704. In one embodiment, the environment controller 702 subjects the multiphase power converter 100, 300, which is power by a power supply 706, to a plurality of tests and observing a response of the multiphase power converter 100, 300 to the tests, e.g., by recording the associated phase currents, error voltage and possible input and output voltages. From these responses, a reward function value 'Reward' is computed based on the actual responses and desired responses. The policy 700 maps the output values $PBCT_x$ of the artificial neural network 114 to updated output values $PBCT_x$ updated that minimize the reward function 704.

The reward function 704 measures how well the phase currents are being balanced during the testing process. For good phase current balance, the reward function 704 provides a high reward value. For poor phase current balance, the reward function 704 provides a low reward value. Determination of how well or how poorly the phase current balance, error voltage information $\vec{V}_{err}$ and/or phase current information $\vec{I}_x$ of the kind previously described herein may be used. Any deviation from zero values are penalized. Depending on the reward value, the policy 700 may make some changes. The changes may be made randomly, at least in the beginning. This is how weights and biases of the artificial neural network 114 are trained, to optimize (e.g. maximize or minimize) the reward function 704. The policy 700 executes reinforcement learning which carries out changes within the artificial neural network 114.

The reward function 704, reinforcement learning algorithm and training collectively yield updated values $PBCT_x$ updated for the artificial neural network 114. Depending on the application, the types of tests that are run may be modified. For example, the tests may be different for memory, POL (point-of-load), etc. The ML agent approach provides much more freedom to modify the ML-based phase current balancer 108. The policy 700 can learn about changes in current behavior over several cycles, to prepare the multiphase power converter 100, 300. The reward function 704 may be programmed for the specific tests being carried out.

To compute the value of the reward function 704, the ML agent may subject the multiphase power converter 100, 300 to certain conditions and the difference of the observed values for input voltage, output voltage and phase currents is recorded and compared to optimal behavior values. In the case of a load step this means that the input and output voltage series should be constantly at the required values, that the phase currents add up to the required load consumption, and that the phase currents should be equal at any point in time.

The policy 700 attempts to find actions, e.g., updates of the $PBCT_x$ value, that allow minimizing the reward function 704. Several approaches may be implemented for the policy 700, from purely random approaches such as Monte Carlo to more sophisticated approaches such as SARSA, Q-learning, Deep Deterministic Policy Gradient, etc. In principal, all of these approaches will work but their convergence behavior may vary dramatically. Yet other policy approaches are possible.

The ML agent may also indicate to the policy 700 and the reward function 704 overcurrent conditions that arise within the multiphase power converter 100, 300 during the tests, so that the policy 700 develops an understanding of admissible values and inadmissible areas over time and the value of the reward function 704 is set to avoid the inadmissible areas.

Other safeguards may be taken. For example, the ML approach is statistics-driven and therefore incorrect predictions may occur. Accordingly, limits may be placed on what the ML-based phase current balancer 108 is permitted to do and not do. If evolution of the phase current balancing goes far off, the ML approach may be modified. Separately or in addition, the multiphase power converter 100, 300 may include an additional phase current balancer for overriding the ML-based phase current balancer 108 when the ML-based phase current balancer 108 provides an incorrect prediction which causes the phase current imbalance to worsen, e.g., when an unexpected or untested condition arises during operation that the ML-based phase current balancer 108 has not be trained for. The backup phase current balancer, e.g. bang-bang, may be in parallel with the ML-based phase current balancer 108. When the phase current balancing results fall outside a defined range, the output of the ML-based phase current balancer 108 may be ignored and instead the output of the backup phase current balancer is used. The switchover range may be set to avoid catastrophic problems such as saturated inductors, damaged switch devices, etc. The multiphase power converter 100, 300 may instead be shutdown system instead of providing a backup phase current balancer, when catastrophic problems arise. The multiphase power converter controller 602 may also have safety measures in place such procedures for handling overcurrent conditions, overtemperature conditions, etc. If a ML misprediction occurs during training, the weights/biases of the artificial neural network 114 are updated accordingly. If a ML misprediction occurs during actual field use, information about the problematic condition may be recorded for later diagnostics.

The ML learning process described herein may result in settings which cause the multiphase power converter 100, 300 to become highly unbalanced, e.g, a setting my apply a really high load to one phase and by this damaging the corresponding switch device or causing a saturated inductor. Hence, phase over current protection may be an event provided to both the reward function 704, e.g. by giving an infinity reward value, and the policy 700. The policy 700 may develop over time an understanding of admissible values and inadmissible areas and avoid the inadmissible areas. For safety reasons and speed, simulations may be used for the initial part of the training process and use ML learning for fine tuning on a real system. Even the best statistical approach may fail for some corner case may arise. For example, a well-balanced system may become highly unbalanced or unstable for very specific test settings, e.g. due to some resonance phenomena. As explained above, an additional regulation scheme such as bang-bang may be run in parallel with the ML-based current balancer 108 and the two update-strategies may be mixed, e.g. by using the mean of the two output values.

Further modifications to the approaches described herein may include providing the current and/or voltage time series information as a time series of digital values. This approach requires a very high sampling frequency of the corresponding signals. Hence, the time vector itself may be computed. Instead of modifying the reference value RV(t) of the modulator 106, a time series of a digital signal may be provided as an output of the ML-based phase current balancer 108 and that is logically combined with the signal REG provided from the regulator 104. Phase dropping and adding may also be implemented with the ML-based phase current balancing approaches described herein. Accordingly, input voltage and input current may be added to include some efficiency information and include this into the reward function 704.

Figure 11:
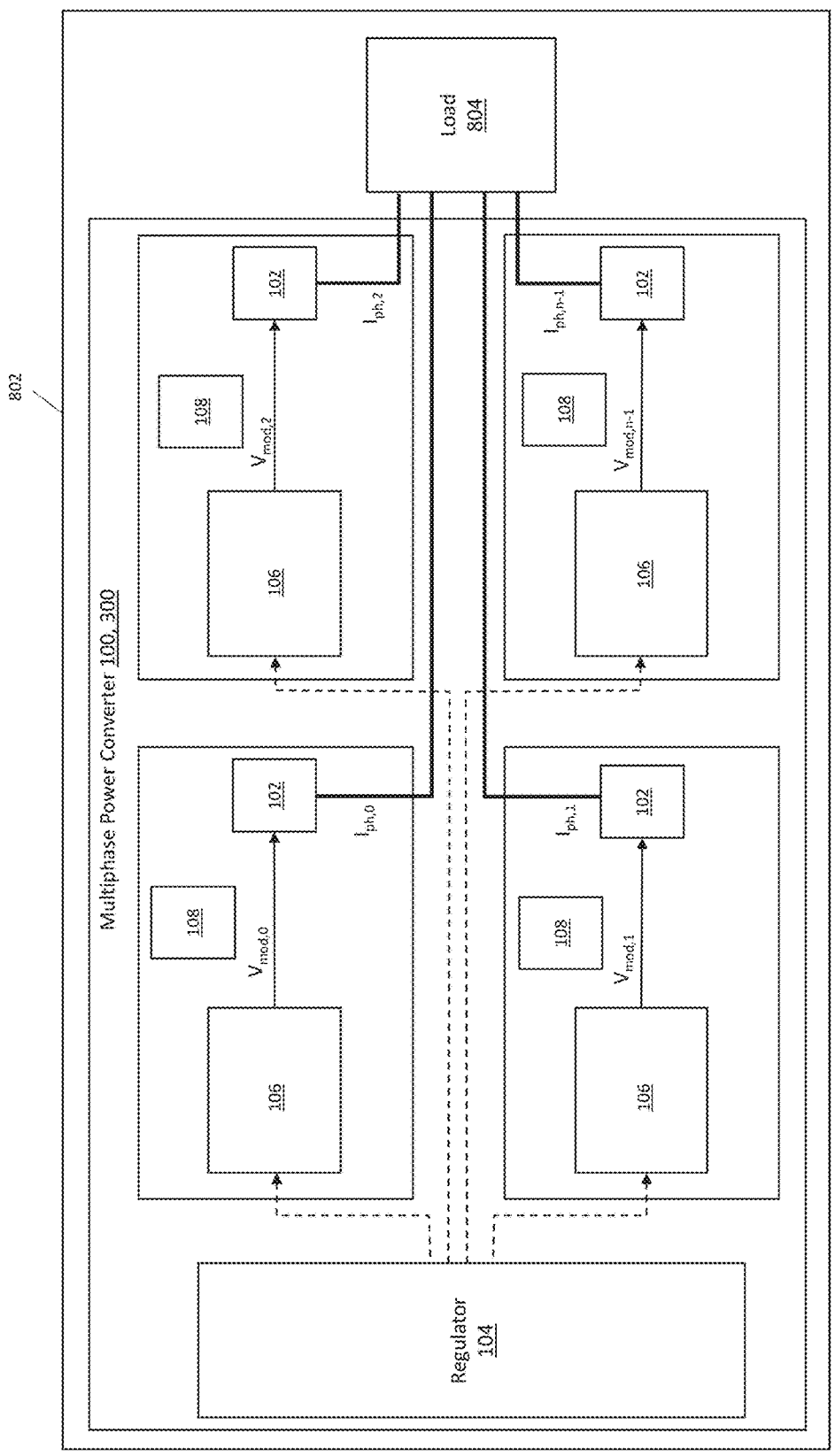
FIG. 11 illustrates a block diagram of an embodiment of an electron system that includes a multiphase power converter having an ML-based phase current balancer.

FIG. 11 illustrates an embodiment of an electronic system 800 that utilizes the ML-based phase current balancer 108 described herein. The electronic system 800 includes a board 802 and at least one load 804 attached to the board 802. In one embodiment, the load 804 is a processor subsystem which may include one or more processors and related memory. The term "processor" as used herein means an electronic circuit which performs operations on an external data source such as memory or some other data stream. The term "processor" as used herein includes CPUs, microprocessors, GPUs, DSPs, image processors, artificial intelligence (AI) accelerators, network or packet processors, coprocessors, multi-core processors, front-end processors, baseband processors, etc. The type of processor depends on the electronic system 400. For example, in the case of a computer, server, mobile device, etc., the load 804 may be a CPU, a microprocessor, a coprocessor, a multi-core processor, a front-end processor, etc. In the case of a network interface that manages radio functions of a wireless network, the load 804 may be a baseband processor. In the case of a graphics card, the load 804 may be a GPU or an image processor. In the case of a network interface card, the load 904 may be a network or packet processor. These are just some examples of electronic systems and related loads, and should not be considered limiting.

A multiphase power converter 100, 300 is attached to the system board 100 and configured to provide dc power to the load 404. For example, in the case of a multi-phase VR, at least two of the power modules 100 may be attached to the system board 100 with each power module 100 providing one phase current to the load 404. Phases may be enabled and disabled at different points of operation, as load demand warrants, Each power module 100 attached to the system board 100 has the construction and function previously described herein. Accordingly, each power module 100 attached to the system board 100 provides a switch node (SW) of a half bridge circuit for supplying an output voltage to the load 404.

A multiphase power converter 100, 300 for providing dc power to the load 804 is also attached to the system board 100. The multiphase power converter 100, 300 includes a plurality of phases 102, each phase 102 being configured to provide a phase current $I_{ph,x}$ to the load 804, a modulator 106 for generating modulation signals $V_{mod,x}$ for switching the respective phases 102 so as to regulate an output voltage of the multiphase power converter 100, 300 provided to the load 804, and the ML-based phase current balancer 108 for aiding in balancing the phase currents $I_{ph,x}$. As previously explained herein, the ML-based phase current balancer 108 includes one or more inputs 110, one or more outputs 112, and an artificial neural network 114 comprising a plurality of artificial neurons 400, 402, 400 and trained to provide corrective phase current imbalance information $I_{ph\_corr,x}$/ $PBCT_x$ at the one or more outputs 112 for correcting imbalance between the individual phase currents $I_{ph,x}$ based on information available at the one or more inputs 110 and indicative of the individual phase currents $I_{ph,x}$. As previously explained herein, the information input to the ML-based phase current balancer 108 and which is indicative of the individual phase currents $I_{ph,x}$ may include phase current measurements $I_{out,x}$ for the individual phases 102, temperature information for the individual phases 102, output voltage ($V_{out}$) information for the multiphase power converter 100, error voltage ($V_{err}$) information for the multiphase power converter 100, and/or information derived from or corresponding to the individual phase modulation signals $V_{mod,x}$.

Although the present disclosure is not so limited, the following numbered examples demonstrate one or more aspects of the disclosure.

Example 1. A machine learning (ML)-based phase current balancer for a multiphase power converter, the ML-based phase current balancer comprising: one or more inputs; one or more outputs; and an artificial neural network comprising a plurality of artificial neurons and trained to provide corrective phase current imbalance information at the one or more outputs for correcting phase current imbalance within the multiphase power converter, based on information available at the one or more inputs and indicative of individual phase currents of the multiphase power converter.

Example 2. The ML-based phase current balancer of example 1, wherein the information available at the one or more inputs comprises phase current measurements for individual phases of the multiphase power converter, and wherein the artificial neural network is trained to provide the corrective phase current imbalance information at the one or more outputs based on the phase current measurements available at the one or more inputs.

Example 3. The ML-based phase current balancer of example 2, wherein the phase current measurements available at the one or more inputs represent a temporal evolution of the phase current for the individual phases of the multiphase power converter.

Example 4. The ML-based phase current balancer of examples 2 or 3, wherein the information available at the one or more inputs further comprises output voltage and/or error voltage information for the multiphase power converter, and wherein the artificial neural network is trained to provide the corrective phase current imbalance information at the one or more outputs also based on the output voltage and/or error voltage information available at the one or more inputs.

Example 5. The ML-based phase current balancer of example 4, further comprising analog-to-digital converter circuitry and a memory queue, wherein the phase current measurements and the output voltage and/or error voltage information are available at the one or more inputs as respective individual voltages, and wherein the analog-to-digital converter circuitry is configured to convert the individual voltages into respective individual digital values for storage in the memory queue for input to the artificial neural network.

Example 6. The ML-based phase current balancer of any of examples 2 through 5, wherein the information available at the one or more inputs further comprises temperature information for the individual phases of the multiphase power converter, and wherein the artificial neural network is trained to provide the corrective phase current imbalance information at the one or more outputs also based on the temperature information available at the one or more inputs.

Example 7. The ML-based phase current balancer of any of examples 1 through 6, wherein the information available at the one or more inputs comprises duty cycle information for individual phases of the multiphase power converter, and wherein the artificial neural network is trained to provide the corrective phase current imbalance information at the one or more outputs based on the duty cycle information available at the one or more inputs.

Example 8. The ML-based phase current balancer of any of examples 1 through 7, wherein the information available at the one or more inputs comprises on-time information, off-time information and tristate-time information for the individual phases of the multiphase power converter, and wherein the artificial neural network is trained to provide the corrective phase current imbalance information at the one or more outputs based on the on-time information, the off-time information and the tristate-time information available at the one or more inputs.

Example 9. The ML-based phase current balancer of example 8, wherein the information available at the one or more inputs further comprises output voltage and/or error voltage information for the multiphase power converter, and wherein the artificial neural network is trained to provide the corrective phase current imbalance information at the one or more outputs also based on the output voltage and/or error voltage information available at the one or more inputs.

Example 10. The ML-based phase current balancer of example 8 or 9, wherein the information available at the one or more inputs further comprises temperature information for the individual phases of the multiphase power converter, and wherein the artificial neural network is trained to provide the corrective phase current imbalance information at the one or more outputs also based on the temperature information available at the one or more inputs.

Example 11. The ML-based phase current balancer of any of examples 1 through 10, wherein the information available at the one or more inputs comprises error voltage information indicative of a difference between a target voltage and an output voltage of the multiphase power converter, and wherein the artificial neural network is trained to provide the corrective phase current imbalance information at the one or more outputs based on the error voltage information available at the one or more inputs.

Example 12. The ML-based phase current balancer of any of examples 1 through 11, wherein the artificial neural network is trained to provide the corrective phase current imbalance information at the one or more outputs as respective correction terms for individual phases of the multiphase power converter.

Example 13. The ML-based phase current balancer of example 12, wherein the artificial neural network is trained to set the correction terms to zero if the phase currents of the multiphase power converter are balanced and a voltage error for the multiphase power converter is within a defined range, and wherein the artificial neural network comprises positive and negative branches between the artificial neurons such that an individual one of the correction terms is negative if the corresponding phase current of the multiphase power converter is below a first threshold and positive if the corresponding phase current is above a second threshold.

Example 14. The ML-based phase current balancer of examples 12 or 13, wherein the artificial neural network is trained to limit the correction terms regardless of the degree of phase current imbalance within the multiphase power converter and/or an amount of voltage error for the multiphase power converter.

Example 15. The ML-based phase current balancer of any of examples 1 through 14, wherein the information available at the one or more inputs comprises a separate time series or time vector for each phase of the multiphase power converter, and wherein the artificial neural network comprises individual first neural networks for processing the separate time series or time vector and a denser second neural network for combining outputs of the individual first neural networks.

Example 16. A multiphase power converter, comprising: a plurality of phases, each phase being configured to provide a phase current to a load coupled to the multiphase power converter; a modulator configured to generate modulation signals for switching the respective phases so as to regulate an output voltage of the multiphase power converter provided to the load; and a machine learning (ML)-based phase current balancer configured to aid in balancing the phase currents. The ML-based phase current balancer comprises: one or more inputs; one or more outputs; and an artificial neural network comprising a plurality of artificial neurons and trained to provide corrective phase current imbalance information at the one or more outputs for correcting imbalance between the individual phase currents, based on information available at the one or more inputs and indicative of the individual phase currents.

Example 17. The multiphase power converter of example 16, wherein the modulator is configured to use the corrective phase current imbalance information provided by the ML-based phase current balancer in generating the modulation signals for switching the respective phases.

Example 18. The multiphase power converter of example 17, wherein the modulator is configured to generate the modulation signals for the respective phases by comparing a timer counter to a reference value for each phase, and wherein the modulator is configured to update the reference value for each phase based on the corrective phase current imbalance information provided by the ML-based phase current balancer.

Example 19. The multiphase power converter of example 18, wherein the artificial neural network of the ML-based phase current balancer is trained to provide the corrective phase current imbalance information at the one or more outputs as respective correction terms for the individual phases, and wherein the modulator is configured to update the reference value for each individual phase by adding the respective correction term to the corresponding reference value for each individual phase.

Example 20, The multiphase power converter of any of examples 16 through 19, wherein the information available at the one or more inputs of the ML-based phase current balancer comprises on-time information, off-time information and tristate-time information for the individual phases of the multiphase power converter, wherein the artificial neural network of the ML-based phase current balancer is trained to provide the corrective phase current imbalance information at the one or more outputs based on the on-time information, the off-time information and the tristate-time information available at the one or more inputs, and wherein the modulator is configured to provide the on-time information, the off-time information and the tristate-time information to the one or more inputs of the ML-based phase current balancer.

Example 21. The multiphase power converter of any of examples 16 through 20, further comprising an additional phase current balancer that overrides the ML-based phase current balancer when the ML-based phase current balancer provides an incorrect prediction which causes the phase current imbalance to worsen.

Example 22. An electronic system, comprising: a board; a load attached to the board; and a multiphase power converter configured to provide dc power to the load. The multiphase power converter comprises: a plurality of phases, each phase being configured to provide a phase current to the load; a modulator configured to generate modulation signals for switching the respective phases so as to regulate an output voltage of the multiphase power converter provided to the load; and a machine learning (ML)-based phase current balancer configured to aid in balancing the phase currents. The ML-based phase current balancer comprises:

one or more inputs; one or more outputs; and an artificial neural network comprising a plurality of artificial neurons and trained to provide corrective phase current imbalance information at the one or more outputs for correcting imbalance between the individual phase currents, based on information available at the one or more inputs and indicative of the individual phase currents.

Example 23. A method for training a machine learning (ML)-based phase current balancer of a multiphase power converter, the method comprising: connecting the multiphase power converter to a test load; and executing a reinforcement-learning algorithm that defines biases and weights for an artificial neural network included in the ML-based phase current balancer, the biases and weights enabling the artificial neural network to provide corrective phase current imbalance information for correcting phase current imbalance that arises within the multiphase power converter while connected to the test load.

Example 24. The method of example 23, wherein executing the reinforcement-learning algorithm comprises: subjecting the multiphase power converter to a plurality of tests and observing a response of the multiphase power converter to the tests; computing a value of a reward function based on a difference between the response of the multiphase power converter to a test and a target response; and implementing a policy that maps output values of the artificial neural network to updated output values that minimize the reward function.

Example 25. The method of example 24, further comprising: indicating to the policy and the reward function overcurrent conditions that arise within the multiphase power converter during the tests, so that the policy develops an understanding of admissible values and inadmissible areas over time and the value of the reward function is set to avoid the inadmissible areas.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A machine learning (ML)-based phase current balancer for a multiphase power converter, the ML-based phase current balancer comprising:
   one or more inputs;
   one or more outputs; and
   an artificial neural network comprising a plurality of artificial neurons and trained to provide corrective phase current imbalance information at the one or more outputs for correcting phase current imbalance within the multiphase power converter, based on information available at the one or more inputs and indicative of individual phase currents of the multiphase power converter,
   wherein the artificial neural network is trained to provide the corrective phase current imbalance information at the one or more outputs as respective correction terms for individual phases of the multiphase power converter,
   wherein the artificial neural network is trained to set the correction terms to zero if the phase currents of the multiphase power converter are balanced and a voltage error for the multiphase power converter is within a defined range,
   wherein the artificial neural network comprises positive and negative branches between the artificial neurons such that an individual one of the correction terms is negative if the corresponding phase current of the multiphase power converter is below a first threshold and positive if the corresponding phase current is above a second threshold.

2. The ML-based phase current balancer of claim 1, wherein the information available at the one or more inputs comprises phase current measurements for individual phases of the multiphase power converter, and wherein the artificial neural network is trained to provide the corrective phase current imbalance information at the one or more outputs based on the phase current measurements available at the one or more inputs.

3. The ML-based phase current balancer of claim 2, wherein the phase current measurements available at the one or more inputs represent a temporal evolution of the phase current for the individual phases of the multiphase power converter.

4. The ML-based phase current balancer of claim 2, wherein the information available at the one or more inputs further comprises output voltage and/or error voltage information for the multiphase power converter, and wherein the artificial neural network is trained to provide the corrective phase current imbalance information at the one or more outputs also based on the output voltage and/or error voltage information available at the one or more inputs.

5. The ML-based phase current balancer of claim 4, further comprising analog-to-digital converter circuitry and a memory queue, wherein the phase current measurements and the output voltage and/or error voltage information are available at the one or more inputs as respective individual voltages, and wherein the analog-to-digital converter circuitry is configured to convert the individual voltages into respective individual digital values for storage in the memory queue for input to the artificial neural network.

6. The ML-based phase current balancer of claim 2, wherein the information available at the one or more inputs further comprises temperature information for the individual phases of the multiphase power converter, and wherein the artificial neural network is trained to provide the corrective phase current imbalance information at the one or more outputs also based on the temperature information available at the one or more inputs.

7. The ML-based phase current balancer of claim 1, wherein the information available at the one or more inputs comprises duty cycle information for individual phases of the multiphase power converter, and wherein the artificial neural network is trained to provide the corrective phase current imbalance information at the one or more outputs based on the duty cycle information available at the one or more inputs.

8. The ML-based phase current balancer of claim 1, wherein the information available at the one or more inputs comprises on-time information, off-time information and tristate-time information for the individual phases of the multiphase power converter, and wherein the artificial neural network is trained to provide the corrective phase current imbalance information at the one or more outputs based on the on-time information, the off-time information and the tristate-time information available at the one or more inputs.

9. The ML-based phase current balancer of claim 8, wherein the information available at the one or more inputs further comprises output voltage and/or error voltage information for the multiphase power converter, and wherein the artificial neural network is trained to provide the corrective phase current imbalance information at the one or more outputs also based on the output voltage and/or error voltage information available at the one or more inputs.

10. The ML-based phase current balancer of claim 8, wherein the information available at the one or more inputs further comprises temperature information for the individual phases of the multiphase power converter, and wherein the artificial neural network is trained to provide the corrective phase current imbalance information at the one or more outputs also based on the temperature information available at the one or more inputs.

11. The ML-based phase current balancer of claim 1, wherein the information available at the one or more inputs comprises error voltage information indicative of a difference between a target voltage and an output voltage of the multiphase power converter, and wherein the artificial neural network is trained to provide the corrective phase current imbalance information at the one or more outputs based on the error voltage information available at the one or more inputs.

12. The ML-based phase current balancer of claim 1, wherein the artificial neural network is trained to limit the correction terms regardless of the degree of phase current imbalance within the multiphase power converter and/or an amount of voltage error for the multiphase power converter.

13. The ML-based phase current balancer of claim 1, wherein the information available at the one or more inputs comprises a separate time series or time vector for each phase of the multiphase power converter, and wherein the artificial neural network comprises individual first neural networks for processing the separate time series or time vector and a denser second neural network for combining outputs of the individual first neural networks.

14. A multiphase power converter, comprising:
a plurality of phases, each phase being configured to provide a phase current to a load coupled to the multiphase power converter;
a modulator configured to generate modulation signals for switching the respective phases so as to regulate an output voltage of the multiphase power converter provided to the load; and
a machine learning (ML)-based phase current balancer configured to aid in balancing the phase currents, the ML-based phase current balancer comprising:
one or more inputs;
one or more outputs; and
an artificial neural network comprising a plurality of artificial neurons and trained to provide corrective phase current imbalance information at the one or more outputs for correcting imbalance between the individual phase currents, based on information available at the one or more inputs and indicative of the individual phase currents,
wherein the modulator is configured to use the corrective phase current imbalance information provided by the ML-based phase current balancer in generating the modulation signals for switching the respective phases,
wherein the modulator is configured to generate the modulation signals for the respective phases by comparing a timer counter to a reference value for each phase,
wherein the modulator is configured to update the reference value for each phase based on the corrective phase current imbalance information provided by the ML-based phase current balancer.

15. The multiphase power converter of claim 14, wherein the artificial neural network of the ML-based phase current balancer is trained to provide the corrective phase current imbalance information at the one or more outputs as respective correction terms for the individual phases, and wherein the modulator is configured to update the reference value for each individual phase by adding the respective correction term to the corresponding reference value for each individual phase.

16. The multiphase power converter of claim 14, wherein the information available at the one or more inputs of the ML-based phase current balancer comprises on-time information, off-time information and tristate-time information for the individual phases of the multiphase power converter, wherein the artificial neural network of the ML-based phase current balancer is trained to provide the corrective phase current imbalance information at the one or more outputs based on the on-time information, the off-time information and the tristate-time information available at the one or more inputs, and wherein the modulator is configured to provide the on-time information, the off-time information and the tristate-time information to the one or more inputs of the ML-based phase current balancer.

17. The multiphase power converter of claim 14, further comprising an additional phase current balancer that overrides the ML-based phase current balancer when the ML-based phase current balancer provides an incorrect prediction which causes the phase current imbalance to worsen.

18. A method for training a machine learning (ML)-based phase current balancer of a multiphase power converter, the method comprising:
connecting the multiphase power converter to a test load; and
executing a reinforcement-learning algorithm that defines biases and weights for an artificial neural network included in the ML-based phase current balancer, the biases and weights enabling the artificial neural network to provide corrective phase current imbalance information for correcting phase current imbalance that arises within the multiphase power converter while connected to the test load,
wherein executing the reinforcement-learning algorithm comprises:
subjecting the multiphase power converter to a plurality of tests and observing a response of the multiphase power converter to the tests;
computing a value of a reward function based on a difference between the response of the multiphase power converter to a test and a target response; and
implementing a policy that maps output values of the artificial neural network to updated output values that minimize the reward function.

19. The method of claim 18, further comprising:
indicating to the policy and the reward function overcurrent conditions that arise within the multiphase power converter during the tests, so that the policy develops an understanding of admissible values and inadmissible areas over time and the value of the reward function is set to avoid the inadmissible areas.

20. A multiphase power converter, comprising:
a plurality of phases, each phase being configured to provide a phase current to a load coupled to the multiphase power converter;
a modulator configured to generate modulation signals for switching the respective phases so as to regulate an output voltage of the multiphase power converter provided to the load;
a machine learning (ML)-based phase current balancer configured to aid in balancing the phase currents, the ML-based phase current balancer comprising:
one or more inputs;
one or more outputs; and
an artificial neural network comprising a plurality of artificial neurons and trained to provide corrective phase current imbalance information at the one or more outputs for correcting imbalance between the individual phase currents, based on information available at the one or more inputs and indicative of the individual phase currents; and
an additional phase current balancer that overrides the ML-based phase current balancer when the ML-based phase current balancer provides an incorrect prediction which causes the phase current imbalance to worsen.

* * * * *